(12) United States Patent
Harada et al.

(10) Patent No.: US 10,937,770 B2
(45) Date of Patent: Mar. 2, 2021

(54) LIGHT-EMITTING DEVICE

(71) Applicant: Stanley Electric Co., Ltd., Tokyo (JP)

(72) Inventors: Mitsunori Harada, Tokyo (JP); Kaori Tachibana, Tokyo (JP); Satoshi Ando, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/248,820

(22) Filed: Jan. 16, 2019

(65) Prior Publication Data

US 2019/0221550 A1   Jul. 18, 2019

(30) Foreign Application Priority Data

Jan. 16, 2018   (JP) .............................. JP2018-005085

(51) Int. Cl.
*H01L 25/075* (2006.01)
*H01L 33/50* (2010.01)
(Continued)

(52) U.S. Cl.
CPC ........ *H01L 25/0753* (2013.01); *H01L 33/483* (2013.01); *H01L 33/505* (2013.01);
(Continued)

(58) Field of Classification Search
CPC ............. H01L 325/0753; H01L 33/505; H01L 25/0753

See application file for complete search history.

(56) References Cited

U.S. PATENT DOCUMENTS

2012/0242216 A1*  9/2012  Kotani ................... H01L 33/60
                                                       313/501
2015/0102366 A1    4/2015  Wada
(Continued)

FOREIGN PATENT DOCUMENTS

DE    10 2009 005 907 A1    7/2010
EP         3 174 110 A1    5/2017
(Continued)

OTHER PUBLICATIONS

Extended European Search Report dated May 16, 2019 in European Application No. 19151930.5.

*Primary Examiner* — Samuel A Gebremariam
*Assistant Examiner* — Jonas T Beardsley
(74) *Attorney, Agent, or Firm* — Xsensus LLP

(57) ABSTRACT

A light-emitting device having light-emitting elements with high operation stability and light extraction efficiency is provided. The light-emitting device includes: a substrate; light-emitting elements aligned and arranged on the substrate in an arrangement direction; wavelength conversion layers each disposed on each of the light-emitting elements with a light-transmitting adhesive interposed therebetween, each of the wavelength conversion layers having an upper surface smaller than a bottom surface, and a side surface shape in which a length in a lateral direction parallel to the bottom surface and perpendicular to the arrangement direction decreases from the bottom surface toward the upper surface; a light-transmitting plate disposed over the wavelength conversion layers; and a reflective resin covering side surfaces of the light-emitting elements, the wavelength conversion layers, and the light-transmitting plate. A side surface of the wavelength conversion layer facing to another adjacent wavelength conversion layer extends in a direction perpendicular to the substrate.

12 Claims, 13 Drawing Sheets

(51) Int. Cl.
    *H01L 33/60*     (2010.01)
    *H01L 33/58*     (2010.01)
    *H01L 33/48*     (2010.01)
    *H01L 33/54*     (2010.01)
    *H01L 33/32*     (2010.01)
    *H01L 33/62*     (2010.01)

(52) U.S. Cl.
    CPC .............. *H01L 33/58* (2013.01); *H01L 33/60* (2013.01); *H01L 33/32* (2013.01); *H01L 33/54* (2013.01); *H01L 33/62* (2013.01); *H01L 2933/0041* (2013.01); *H01L 2933/0091* (2013.01)

(56) References Cited

U.S. PATENT DOCUMENTS

| | | |
|---|---|---|
| 2015/0207045 A1 | 7/2015 | Wada et al. |
| 2015/0263254 A1* | 9/2015 | Miyoshi ................ H01L 33/505 257/98 |
| 2017/0365746 A1 | 12/2017 | Vampola et al. |

FOREIGN PATENT DOCUMENTS

| | | |
|---|---|---|
| EP | 3 211 678 A1 | 8/2017 |
| JP | 2015-138838 A | 7/2015 |

\* cited by examiner

LIGHT-EMITTING DEVICE

This application claims the priority benefit under 35 U.S.C. § 119 of Japanese Patent Application No. 2018-005085 filed on Jan. 16, 2018, which is hereby incorporated in its entirety by reference.

TECHNICAL FIELD

The presently disclosed subject matter relates to a light-emitting device including a light-emitting element such as a light-emitting diode.

BACKGROUND ART

A light-emitting device includes, for example, a substrate provided with terminals, wirings, etc., and at least one light-emitting element mounted on the substrate. In addition, for example, when the light-emitting device is used for illumination, the light-emitting device includes a wavelength converter such as a fluorescent material layer disposed on the light-emitting element. For example, Japanese Patent Application Laid-Open No. 2015-138838 (U.S. Patent Application Publication No. 2015/207045A1 corresponding thereto) discloses a light-emitting device including a plurality of light-emitting elements, a fluorescent material-containing film provided on the plurality of light-emitting elements, and a light-transmitting plate material provided on the fluorescent material-containing film.

It is preferable that the light-emitting device stably emits light even under various environments. In particular, considering the case where the light-emitting device is used in a vehicular lamp, it is preferable that the light-emitting device stably emits light for a long period of time even when it is driven with a large current. In a light-emitting device having a plurality of light-emitting elements, stable operation of each of the light-emitting elements is required. The light-emitting device preferably has high light extraction efficiency.

SUMMARY

The presently disclosed subject matter has been made in view of these and other problems and features in association with the conventional art. According to an aspect of the presently disclosed subject matter, there is provided a light-emitting device having a plurality of light-emitting elements with high operation stability and light extraction efficiency.

According to another aspect of the presently disclosed subject matter, a light-emitting device includes: a substrate; a plurality of light-emitting elements aligned and arranged on the substrate in an arrangement direction; a plurality of wavelength conversion layers each disposed on each of the plurality of light-emitting elements with a light-transmitting adhesive interposed therebetween, each of the wavelength conversion layers having a bottom surface close to the light-emitting element and an upper surface smaller than the bottom surface, and a side surface shape in which a length in a lateral direction parallel to the bottom surface and perpendicular to the arrangement direction of the light-emitting elements decreases from the bottom surface toward the upper surface; a light-transmitting plate disposed over the upper surfaces of the plurality of wavelength conversion layers; and a reflective resin covering side surfaces of each of the plurality of light-emitting elements, side surfaces forming outer edge portions of the plurality of wavelength conversion layers, and side surfaces of the light-transmitting plate, wherein a side surface of each of the plurality of wavelength conversion layers facing to another adjacent wavelength conversion layer extends in a direction perpendicular to the substrate.

In the light-emitting device with the aforementioned configuration, at least one of the side surfaces forming the outer edge portions of the plurality of wavelength conversion layers may preferably has an inclined portion inclined from the direction perpendicular to the substrate toward inside of the wavelength conversion layer. In this case, each of the side surfaces extending in the arrangement direction out of the side surfaces forming the outer edge portions of the plurality of wavelength conversion layers may preferably has the inclined portion.

Furthermore, in the light-emitting device with the aforementioned configuration, the light-transmitting plate may preferably be disposed on the plurality of wavelength conversion layers with a light-transmitting adhesive interposed therebetween, and the adhesive may preferably fill a region between each of the plurality of wavelength conversion layers and another wavelength conversion layer adjacent thereto.

According to another aspect of the presently disclosed subject matter, a light-emitting device includes: a substrate; a plurality of light-emitting elements aligned and arranged on the substrate in an arrangement direction; a plurality of wavelength conversion layers each disposed on each of the plurality of light-emitting elements with a light-transmitting adhesive interposed therebetween; a plurality of individual light-transmitting plates each disposed on each of the plurality of wavelength conversion layers, each of the light-transmitting plates having a bottom surface close to the wavelength conversion layer and an upper surface smaller than the bottom surface, and a side surface shape in which a length in a lateral direction parallel to the bottom surface and perpendicular to the arrangement direction of the wavelength conversion layers decreases from the bottom surface toward the upper surface; a common light-transmitting plate arranged over the upper surfaces of the plurality of individual light-transmitting plates; and a reflective resin covering side surfaces of each of the plurality of light-emitting elements, side surfaces of each of the plurality of wavelength conversion layers, side surfaces forming outer edge portions of the plurality of individual light-transmitting plates, and side surfaces of the common light-transmitting plate, wherein a side surface of each of the plurality of individual light-transmitting plates facing to another adjacent individual light-transmitting plate extends in a direction perpendicular to the substrate.

In the light-emitting device with the aforementioned configuration, at least one of the side surfaces forming the outer edge portions of the plurality of individual light-transmitting plates may preferably have an inclined portion inclined from the direction perpendicular to the substrate toward inside of the individual light-transmitting plate. In this case, each of the side surfaces extending in the arrangement direction out of the side surfaces forming the outer edge portions of the plurality of individual light-transmitting plates may preferably have the inclined portion.

In the light-emitting device with the aforementioned configuration, the common light-transmitting plate may preferably be disposed on the plurality of individual light-transmitting plates with a light-transmitting adhesive interposed therebetween, and the adhesive may preferably fill a region between each of the plurality of individual light-transmitting plates and another individual light-transmitting plate adjacent thereto.

In the light-emitting device with the aforementioned configuration, each of the plurality of wavelength conversion layers may preferably have a uniform thickness, and each of the side surfaces of the plurality of wavelength conversion layers may preferably extend in the direction perpendicular to the substrate.

In the light-emitting device with the aforementioned configuration, the common light-transmitting plate may preferably be disposed over the plurality of individual light-transmitting plates with a light-transmitting adhesive interposed therebetween and may preferably have a length smaller than a distance between end portions of the entire plurality of individual light-transmitting plates in the arrangement direction, and the adhesive for bonding the common light-transmitting plate and the plurality of individual light-transmitting plates may preferably be provided from the upper surfaces of the plurality of individual light-transmitting plates to end side surfaces of the common light-transmitting plate in the arrangement direction.

BRIEF DESCRIPTION OF DRAWINGS

These and other characteristics, features, and advantages of the presently disclosed subject matter will become clear from the following description with reference to the accompanying drawings, wherein.

DESCRIPTION OF EXEMPLARY EMBODIMENTS

A description will now be made below to light-emitting devices of the presently disclosed subject matter with reference to the accompanying drawings in accordance with exemplary embodiments.

First Exemplary Embodiment

Figure 1A:
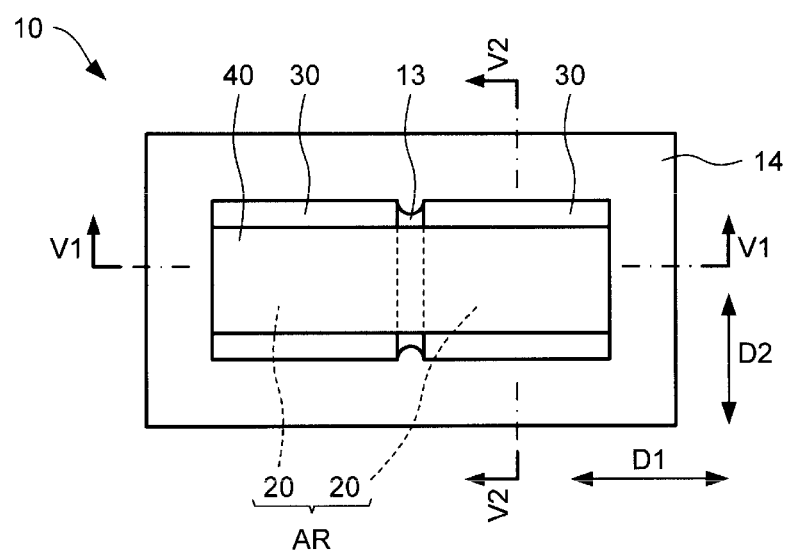
FIG. 1A is a top plan view of a light-emitting device according to a first exemplary embodiment made in accordance with principles of the presently disclosed subject matter.
Figure 1B:
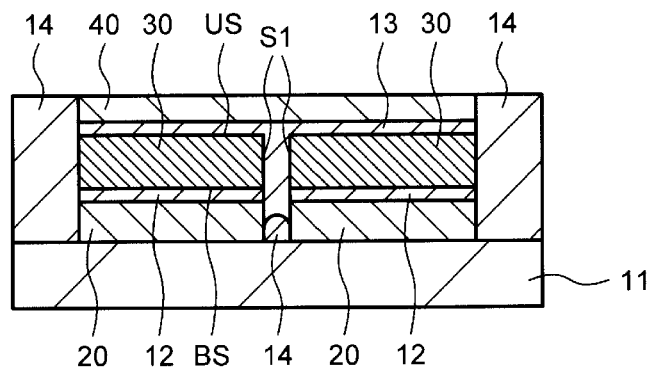
FIG. 1B is a cross-sectional view of the light-emitting device according to the first exemplary embodiment taken along line V1-V1 in FIG. 1A.
Figure 1C:
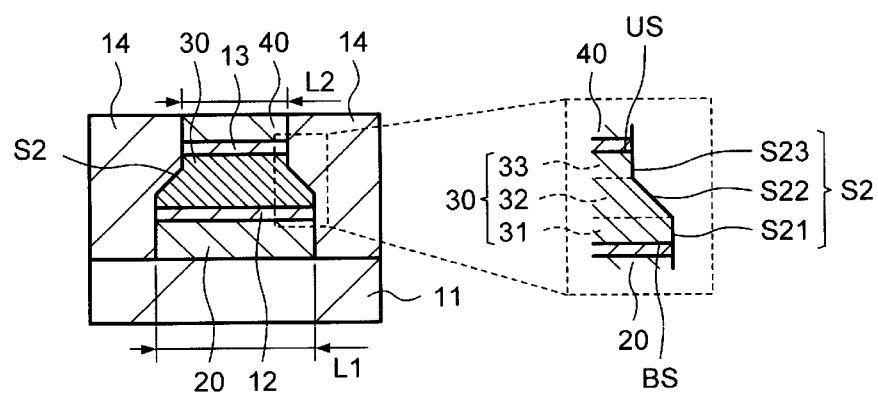
FIG. 1C is a cross-sectional view of the light-emitting device according to the first exemplary embodiment taken along line V2-V2 in FIG. 1A.

FIG. 1A is a top plane view of a light-emitting device 10 according to a first exemplary embodiment. FIGS. 1B and 1C are cross-sectional views of the light-emitting device 10 taken along line V1-V1 and taken along line V2-V2 of FIG. 1A, respectively. A configuration of the light-emitting device 10 will be described with reference to FIGS. 1A to 1C. Herein, the light-emitting device 10 includes a mounting substrate (or a first substrate, hereinafter, simply referred to as a "substrate") 11 and a plurality of light-emitting elements 20 aligned and arranged on the substrate 11.

The substrate 11 has, for example, a metal wiring (not shown) for supplying power to each of the light-emitting elements 20, and has a mounting surface on which each of the light-emitting elements 20 is mounted. In the present exemplary embodiment, the substrate 11 has a flat plate shape, and one of its principal surfaces is used as the mounting surface. The substrate 11 is formed of a material having high thermal conductivity, for example, AlN. The mounting surface of the substrate 11 serves as a mounting surface on which each of the light-emitting elements 20 is mounted, and each of the light-emitting elements 20 is fixed on the mounting surface of the substrate 11.

Each of the light-emitting elements 20 is a semiconductor light-emitting element such as a light-emitting diode. Each of the light-emitting elements 20 includes, for example, a support substrate (second substrate) and an optical semiconductor layer formed of a nitride-based semiconductor supported by the support substrate. In the present exemplary embodiment, each of the light-emitting elements 20 is mounted on the substrate 11 by flip-chip mounting.

In the present exemplary embodiment, each of the light-emitting elements 20 has a rectangular upper surface shape. Each of the light-emitting elements 20 is arranged in a row on the substrate 11. In the present exemplary embodiment, a case where the light-emitting device 10 includes two light-emitting elements 20 will be described. Each of the light-emitting elements 20 constitutes a light-emitting element array AR in the light-emitting device 10. Each of the light-emitting elements 20 forms a light-emitting surface of the light-emitting element array AR as a whole.

Hereinafter, a direction D1 in which the light-emitting elements 20 are arranged in a direction parallel to the mounting surface of the substrate 11 is referred to as an arrangement direction of the light-emitting elements 20 or the light-emitting element array AR. A direction D2 parallel to the mounting surface and perpendicular to the direction D1 in which the light-emitting elements 20 are arranged is referred to as a lateral direction of the light-emitting element 20 or the light-emitting element array AR.

In the present exemplary embodiment, the light-emitting element array AR forms a light distribution extending in a line shape along the arrangement direction D1 of the light-emitting elements 20. Therefore, the arrangement direction D1 of the light-emitting elements 20 corresponds to the longitudinal direction of the light-emitting element array AR, and the lateral direction D2 of the light-emitting elements 20 corresponds to the short-side direction of the light-emitting element array AR.

Each of the light-emitting elements 20 may be arranged in a plurality of rows, for example, and even in this case, the direction in which the light-emitting elements 20 are arranged is the arrangement direction D1, and the direction perpendicular thereto is the lateral direction D2. Further, the arrangement of the light-emitting elements 20 is not limited to the case where the light emitting elements are linearly arranged, but may be partially bent, for example.

The light-emitting device 10 includes a plurality of wavelength conversion layers 30, each of which is disposed on each of the plurality of light-emitting elements 20 with an adhesive layer 12 interposed therebetween. Each of the wavelength conversion layers 30 is, for example, a ceramic plate obtained by sintering a fluorescent material or a resin layer containing fluorescent material particles. As the wavelength conversion layer 30, for example, a ceramic plate produced by high-temperature sintering of alumina and a YAG fluorescent material may be used.

Each of the wavelength conversion layers 30 is bonded onto the upper surface of each of the light-emitting elements 20 with an adhesive layer 12 interposed therebetween. Thus, the respective wavelength conversion layers 30 are arranged along the arrangement direction D1 of the light-emitting elements 20. That is, the arrangement direction D1 and the lateral direction D2 of the light-emitting elements 20 correspond to the arrangement direction and the lateral direction of the wavelength conversion layers 30, respectively.

As illustrated in FIG. 1C, each of the wavelength conversion layers 30 has a side surface shape in which the length of the wavelength conversion layer 30 in the lateral direction D2 of each of the light-emitting elements 20 decreases as the distance from the light-emitting element 20 increases.

In the present exemplary embodiment, each of the wavelength conversion layers 30 has a bottom surface BS which is a principal surface on a side closer to the light-emitting element 20, and an upper surface US which is a principal surface on the opposite side to the bottom surface BS and is smaller than the bottom surface BS. The width L2 of the upper surface US of each wavelength conversion layer 30 in the lateral direction D2 is shorter than the width L1 of the bottom surface BS of each wavelength conversion layer 30 in the lateral direction D2.

Specifically, in this exemplary embodiment as illustrated in FIG. 1B, the side surface S1 of each of the wavelength conversion layers 30 facing to the other adjacent wavelength conversion layer 30 has a shape extending in the direction perpendicular to the substrate 11.

On the other hand, as illustrated in FIG. 1C, the side surface S2 extending in the arrangement direction D1 of each of the wavelength conversion layers 30 has an inclined portion (tapered portion) S22 inclined from the direction perpendicular to the substrate 11 toward the inside of the wavelength conversion layer 30.

In this exemplary embodiment, the side surface S2 of the wavelength conversion layer 30 includes a vertical portion (first vertical portion) S21 extending from the bottom surface BS of the wavelength conversion layer 30 in the direction perpendicular to the substrate 11, the inclined portion S22 continued from the vertical portion S21, and a vertical portion (second vertical portion) S23 extending in the direction perpendicular to the substrate 11 from the inclined portion S22 and reaching the upper surface US.

Therefore, in this exemplary embodiment, it can be said that each of the wavelength conversion layers 30 has a structure in which a prism-shaped portion 31, a frustum-shaped portion 32, and a prism-shaped portion 33 having a bottom surface smaller than that of the prism-shaped portion 31 are integrally formed from the light-emitting element 20 side.

The upper surface US of each of the wavelength conversion layers 30 is disposed on the inner side of the outer edge of the light-emitting element 20 when viewed from the upper surface, that is, when viewed in the direction perpendicular to the substrate 11 from above. Also in the whole of the plurality of wavelength conversion layers 30, each of the upper surfaces US thereof is disposed inside the outer edge of the light-emitting surface of the light-emitting element array AR.

Figure 2A:
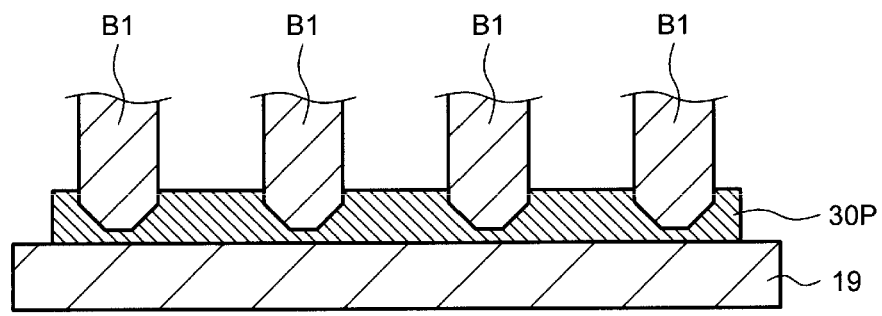
FIG. 2A is a diagram illustrating a production method of the wavelength conversion layer in the light-emitting device according to the first exemplary embodiment.
Figure 2B:
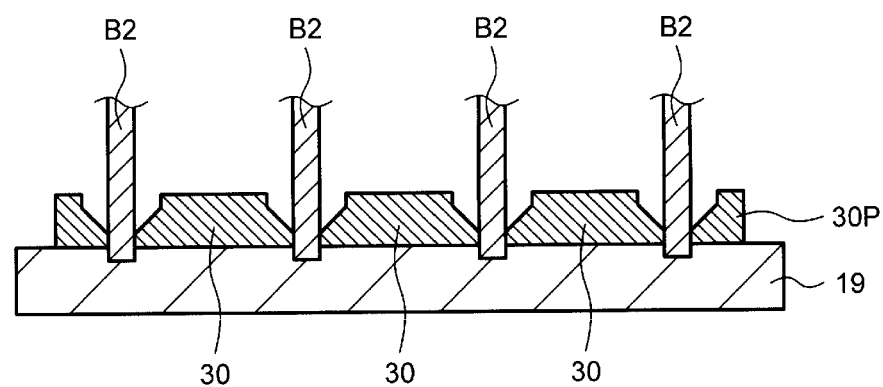
FIG. 2B is a diagram illustrating a production method of the wavelength conversion layer in the light-emitting device according to the first exemplary embodiment.

The wavelength conversion layer 30 may be produced by, for example, a production method as illustrated in FIGS. 2A and 2B. FIG. 2A is a cross-sectional view schematically illustrating a dicing sheet 19, a fluorescent material ceramic plate 30P disposed on the dicing sheet 19, and first blades B1 used in processing the ceramic plate 30P. FIG. 2A illustrates the first blades B1 inserted into the fluorescent material ceramic sheet 30P, and in particular, illustrates only a portion of the first blades B1 on the fluorescent material ceramic plate 30P side.

First, as illustrated in FIG. 2A, the fluorescent material ceramic plate 30P is disposed on the dicing sheet 19. Subsequently, the first blades B1 are prepared, the tip of which has a portion (tapered portion) having a cross-sectional shape of an isosceles trapezoid, and has a vertical surface extending continuously from a portion on the lower bottom side of the isosceles trapezoid in a direction perpendicular to the upper bottom of the isosceles trapezoid.

Then, grooves are formed in the upper surface of the fluorescent material ceramic plate 30P by using the first blades B1. Here, the first blades B1 are inserted so that the vertical surface of the first blade B1 enters the interior of the fluorescent material ceramic plate 30P. As a result, portions to be the vertical portions S23 of the wavelength conversion layer 30 are formed in the upper portions of the grooves of the fluorescent material ceramic plate 30P processed by the vertical surfaces of the first blades B1. In addition, portions of the wavelength conversion layer 30 to be the inclined portions S22 are formed in the lower portions of the grooves of the fluorescent material ceramic plate 30P processed by the tapered portions of the first blades B1.

Next, FIG. 2B is a cross-sectional view illustrating second blades B2 used in processing the fluorescent material ceramic sheet 30P. In the present exemplary embodiment, blades having mutually parallel side surfaces are prepared as the second blades B2.

Then, as illustrated in FIG. 2B, the second blades B2 are inserted into the bottom surfaces of the grooves of the fluorescent material ceramic plate 30P formed by the first blades B1, so that the fluorescent material ceramic plate 30P is cut into pieces. As a result, the plate piece of the cut fluorescent material ceramic plate 30P becomes the wavelength conversion layer 30. When the fluorescent material ceramic plate 30P is cut, the side surfaces of the second blades B2 are inserted in a direction perpendicular to the fluorescent material ceramic plate 30P. As a result, the surfaces to be processed of the fluorescent material ceramic plate 30P by the second blades B2 become the vertical portions S21 of the wavelength conversion layer 30.

The wavelength conversion layer 30 may be formed, for example, by processing the fluorescent material ceramic plate 30P using the first and second blades B1 and B2 in the aforementioned manner. As a result, the vertical portions S21, the inclined portions S22, and the vertical portions S23 are formed on the side surfaces S2 of the wavelength conversion layer 30 with high shape accuracy.

Referring again to FIGS. 1A to 1C, the light-emitting device 10 includes a light-transmitting plate 40 disposed over the upper surfaces US of the plurality of respective wavelength conversion layers 30 with the adhesive 13 interposed therebetween. The light-transmitting plate 40 has a light-transmitting property with respect to light emitted from each of the light-emitting elements 20.

The light-transmitting plate 40 is a plate-like member that is integrally formed and disposed on the wavelength conversion layer 30 so as to cover the entire upper surfaces US of the respective wavelength conversion layers 30. That is, the light-transmitting plate 40 entirely covers the upper surfaces US of the wavelength conversion layers 30 with the adhesive 13 interposed therebetween. In the present exemplary embodiment, the light-transmitting plate 40 has a width corresponding to the width L2 of the upper surface US of each of the wavelength conversion layers 30 in the lateral direction D2. The light-transmitting plate 40 also has a length that is the sum of the lengths of the respective upper surfaces US of the wavelength conversion layers 30 in the arrangement direction D1 and the distance between the adjacent wavelength conversion layers 30 in the arrangement direction D1.

The adhesive 13 for bonding the light-transmitting plate 40 and each of the wavelength conversion layers 30 fills a region (space) between each of the wavelength conversion layers 30 and another wavelength conversion layer 30 adjacent thereto. Therefore, the adhesive 13 is provided over the entire bottom surface of the light-transmitting plate 40. The adhesive layer 12 and the adhesive 13 have a light-transmitting property with respect to the light output from the light-emitting element 20 and the wavelength conversion layer 30.

In addition, the light-emitting device 10 includes a reflective resin 14 that surrounds and covers the side surfaces of the light-emitting elements 20, the side surfaces forming the outer edge portions of the wavelength conversion layers 30, and the side surfaces of the light-transmitting plate 40. The upper surface of the light-transmitting plate 40 is exposed from (is not covered with) the reflective resin 14. The reflective resin 14 is formed of a resin material having reflectivity with respect to light emitted from each of the light-emitting elements 20 and light output from the wavelength conversion layers 30.

Light emitted from each of the light-emitting elements 20 enters each of the wavelength conversion layers 30, and after the wavelength of at least part of the light is converted, the light is extracted from the upper surface of the light-transmitting plate 40 to the outside. Light traveling from each of the light-emitting elements 20, each of the wavelength conversion layers 30, and the light-transmitting plate 40 toward the respective side surfaces thereof is reflected by the reflective resin 14. Therefore, most of the light is extracted to the outside only from the upper surface of the light-transmitting plate 40.

In the present exemplary embodiment, one wavelength conversion layer 30 is disposed on each of the light-emitting elements 20, and one light-transmitting plate 40 is disposed so as to cover the entire wavelength conversion layers 30. Therefore, the light output from each of the plurality of light-emitting elements 20 and each of the wavelength conversion layers 30 is collected in one light-transmitting plate 40 and taken out to the outside therethrough. That is, the emitted light from each of the light-emitting elements 20 is taken out to the outside as integral light. Accordingly, the intensity uniformity of the light extracted from the light-emitting device 10 is improved. In addition, since the light-transmitting adhesive 13 fills the region between the adjacent wavelength conversion layers 30, the intensity uniformity of light is further improved.

In addition, since the light-transmitting adhesive 13 is provided over the entire bottom surface of the light-transmitting plate 40, the intensity uniformity of the extracted light becomes higher. In addition, since the side surface S1 of the wavelength conversion layer 30 facing another adjacent wavelength conversion layer 30 extends in the direction perpendicular to the substrate 11, a large amount of light enters the light-transmitting plate 40 corresponding to the portion between the adjacent wavelength conversion layers 30. Therefore, the intensity uniformity of light is improved.

In the wavelength conversion layer 30, the side surface S2 present in the lateral direction D2 is inclined, and the light-transmitting plate 40 having a size corresponding to the upper surfaces US thereof is disposed on the upper surfaces US. As a result, the light from the wavelength conversion layers 30 is collected to the light-transmitting plate 40 smaller in size than the bottom surfaces BS of the wavelength conversion layers 30. Therefore, high-intensity light is extracted from the light-transmitting plate 40. In this exemplary embodiment, the reflective resin 14 is formed so as to fill the space between the adjacent light-emitting elements 20 at least in part. Therefore, the light emitted from the light-emitting element 20 enters the wavelength conversion layer 30 in a state of maintaining a high intensity. Therefore, the intensity of the extracted light becomes higher.

In addition, since the wavelength conversion layers 30 are disposed correspondingly for the respective light-emitting elements 20, heat dissipation is improved as compared with a case where one wavelength conversion layer is arranged across a plurality of light-emitting elements 20. More specifically, for example, even if the thickness of each of the light-emitting element 20 and the wavelength conversion layer 30 is slightly different due to a production error, the layer thickness of the adhesive layer 12 can be formed thinly and uniformly. Therefore, the heat radiation path can be stably formed.

If one wavelength conversion layer is bonded over a plurality of light-emitting elements 20, the thickness of the bonding layer 12 is not stabilized, and it is difficult that heat generated in the wavelength conversion layer 30 is stably escaped to the outside from all of the light-emitting elements 20. Therefore, for example, when driving is performed with a large current or for a long period of time, heat generated in the wavelength conversion layer 30 remains within the wavelength conversion layer 30, and the temperature of the wavelength conversion layer 30 rises, thereby causing a decrease in the wavelength conversion efficiency and quenching.

Note that the inventors of the present application compared the light-emitting device 10 according to the present exemplary embodiment with a light-emitting device in which one wavelength conversion layer was disposed, and confirmed that the light-emitting device 10 can suppress color unevenness and intensity unevenness of extracted light, and has high intensity persistence. That is, it has been confirmed that the light-emitting device 10 has high operation stability and high light extraction efficiency.

Further, in the present exemplary embodiment, the light-transmitting plate 40 has substantially the same outer shape (dimension) as that of the outer edge when the entire wavelength conversion layers 30 are surrounded. In this case, for example, the light-transmitting plate 40 is self-aligned through the adhesive 13 to the entire outer edge of the wavelength conversion layers 30, even if the wavelength conversion layers 30 have slightly different sizes due to production errors, or even if they are slightly misaligned in position and angle. Therefore, the light-transmitting plate 40 can be stably arranged to cover the entire wavelength conversion layers 30.

The wavelength conversion layer 30 is not limited to the case where the vertical portions S21 and S23 are provided. However, it is preferable that the wavelength conversion layer 30 has the vertical portions S21 and S23. Specifically, when the vertical portion S21 is provided below the inclined portion S22, the light extraction efficiency is stably improved. In addition, when the vertical portion S23 is provided, the holding force of the adhesive 13 on the wavelength conversion layer 30 is increased, and when the light-transmitting plate 40 is disposed via the adhesive 13, self-alignment using the surface tension of the adhesive 13 can be advantageously performed.

As described above, the light-emitting device 10 includes the substrate 11, the plurality of light-emitting elements 20 arranged on the substrate 11, the plurality of wavelength conversion layers 30 each disposed on each of the plurality of light-emitting elements 20 with the light-transmitting adhesive 12 interposed therebetween and having the bottom surface BS on the light-emitting element 20 side and the upper surface US smaller than the bottom surface BS with a side surface shape such that the length in the lateral direction D2 perpendicular to the arrangement direction D1 of the light-emitting elements 20 decreases from the bottom surface BS to the upper surface US, the light-transmitting plate 40 disposed over the upper surfaces US of the plurality of wavelength conversion layers 30, and the reflective resin 14 covering the side surfaces of each of the light-emitting elements 20, the side surfaces forming the outer edge portions of each of the wavelength conversion layers 30, and the side surfaces of the light-transmitting plates 40. The side surface S1 of each of the wavelength conversion layers 30 facing the other adjacent wavelength conversion layers 30 extends in the direction perpendicular to the substrate 11, i.e., in the direction perpendicular to the mounting surface of the light-emitting element 20 on the substrate 11, and in the present exemplary embodiment, in the direction parallel to the side surface of the light-emitting element 20. Accordingly, it is possible to provide the light-emitting device 10 having a plurality of light-emitting elements 20 with high operation stability and light extraction efficiency.

Figure 3A:
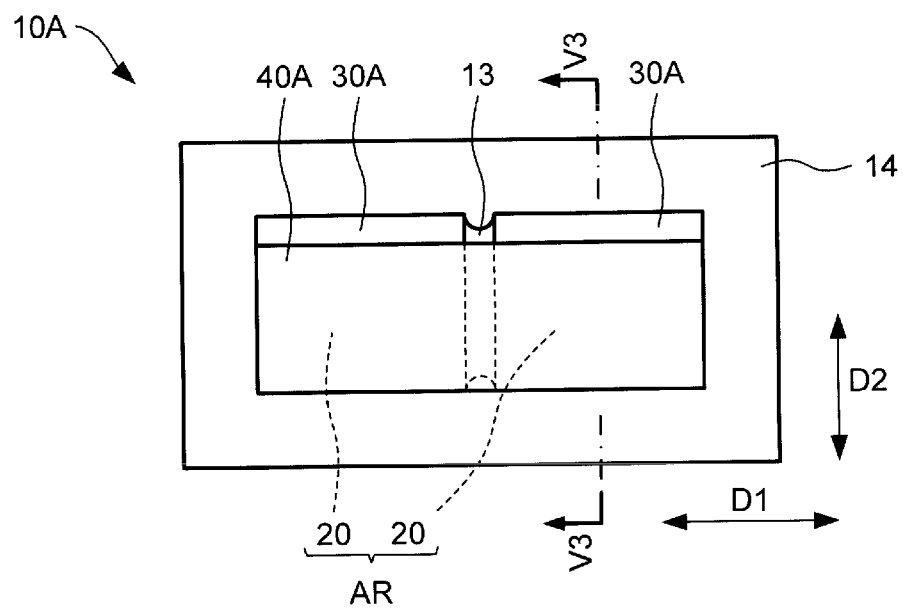
FIG. 3A is a top plan view of the light-emitting device according to a first modified example of the first exemplary embodiment.
Figure 3B:
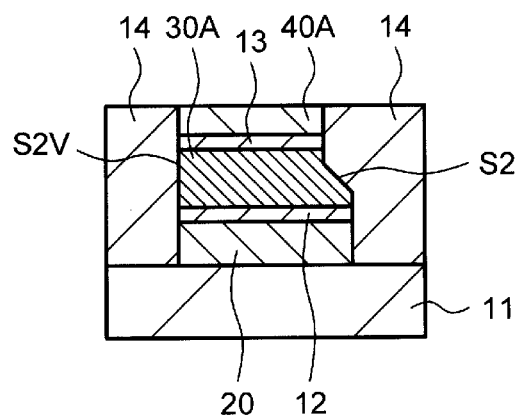
FIG. 3B is a cross-sectional view of the light-emitting device according to the first modified example of the first exemplary embodiment.

FIG. 3A is a top plan view of a light-emitting device 10A according to a first modified example of the first exemplary embodiment. FIG. 3B is a cross-sectional view of the light-emitting device 10A taken along line V3-V3 of FIG. 3A. The light-emitting device 10A will be described with reference to FIGS. 3A and 3B.

The light-emitting device 10A has the same configuration as that of the light-emitting device 10 except for the configuration of the wavelength conversion layer 30A and the light-transmitting plate 40A. In the light-emitting device 10A, one of the side surfaces of each of the wavelength conversion layers 30A in the lateral direction D2 has a shape extending in a direction perpendicular to the substrate 11. Specifically, as illustrated in FIG. 3B, one of the side surfaces S2 and S2V extending along the arrangement direction D1 of the wavelength conversion layers 30A has the same shape as that of the wavelength conversion layer 30. On the other hand, the other side surface S2V has a shape extending along a direction perpendicular to the substrate 11. Like the light-transmitting plate 40, the light-transmitting plate 40A has substantially the same outer shape as the outer edge surrounding the entire upper surfaces of the wavelength conversion layers 30A.

As in the present modified example, only one of the side surfaces of the wavelength conversion layer 30A in the lateral direction D2 may be inclined. Even in this case, the length of the wavelength conversion layer 30A in the lateral direction D2 decreases as the distance from the light-emitting element 20 increases. In addition, since the side surface S2 has the inclined portion S22, light collecting property in the wavelength conversion layer 30A can be obtained. Accordingly, it is possible to provide the light-emitting device 10A having a plurality of light-emitting elements 20 with high operation stability and light extraction efficiency.

By inclining only one side surface S2 as in the present modified example, light of a relatively high luminance is extracted from the side surface S2 side, and light of a relatively low luminance is extracted from the side surface S2V side. That is, it is possible to intentionally provide a difference in luminance in the lateral direction D2 of the wavelength conversion layer 30A. It can be said that the light-emitting device 10A has a structure suitable for an application in which it is preferable to provide a difference in luminance for each region, such as a case where the light-emitting device 10A is used as a vehicular lamp.

Figure 4A:
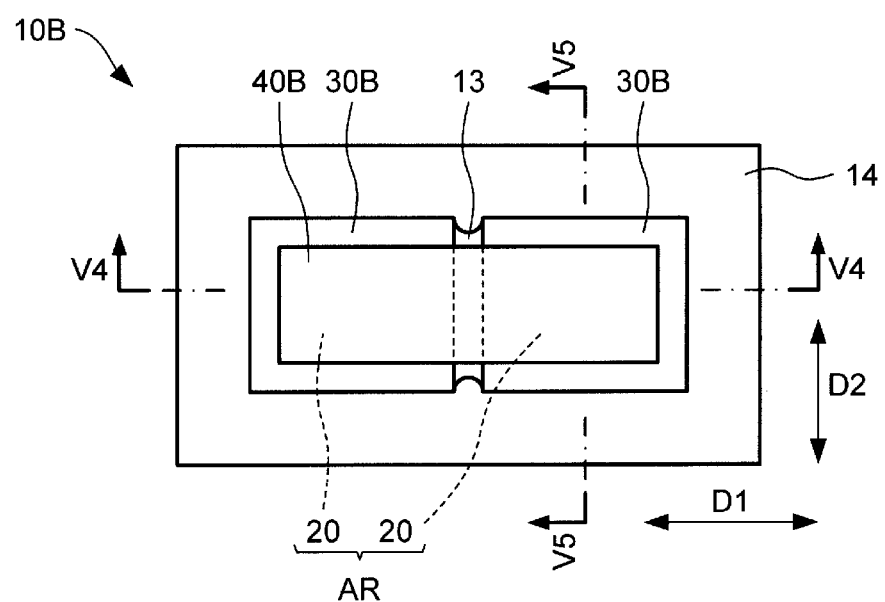
FIG. 4A is a top plan view of the light-emitting device according to a second modified example of the first exemplary embodiment.
Figure 4B:
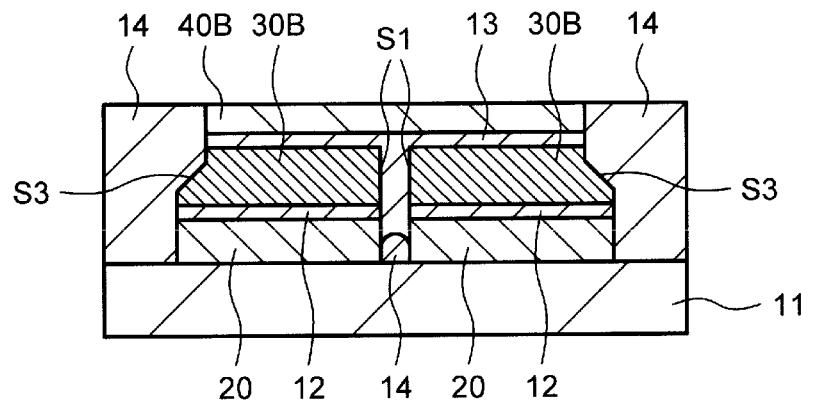
FIG. 4B is a cross-sectional view of the light-emitting device according to the second modified example of the first exemplary embodiment.
Figure 4C:
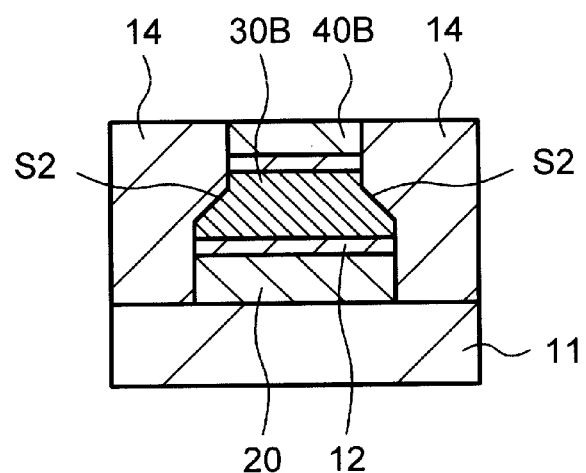
FIG. 4C is a cross-sectional view of the light-emitting device according to the second modified example of the first exemplary embodiment.

FIG. 4A is a top plan view of a light-emitting device 10B according to a second modified example of the first exemplary embodiment, and FIGS. 4B and 4C are cross-sectional views of the light-emitting device 10B. FIGS. 4B and 4C are cross-sectional views taken along line V4-V4 and line V5-V5 in FIG. 4A, respectively. The light-emitting device 10B will be described with reference to FIGS. 4A to 4C.

The light-emitting device 10B has the same configuration as that of the light-emitting device 10 except for the configuration of the wavelength conversion layer 30B and the light-transmitting plate 40B. In the light-emitting device 10B, the wavelength conversion layer 30B has an inclined side surface shape in which the side surface S3 extending along the lateral direction D2 at the end in the arrangement direction D1 of the wavelength conversion layer 30B has an inclined side surface shape. The light-transmitting plate 40B has substantially the same outer shape as the outer edge surrounding the entire upper surfaces of the wavelength conversion layers 30B.

That is, in the present modified example, each of the wavelength conversion layers 30B has a side surface shape in which both the lengths in the arrangement direction D1 and in the lateral direction D2 of the wavelength conversion layer 30B decrease from the bottom surface BS toward the upper surface US. Therefore, all of the side surfaces S2 and S3 forming the outer edge portion of the wavelength conversion layers 30B in each of the wavelength conversion layers 30B have a shape inclined from the direction perpendicular to the substrate 11 toward the inner side of the wavelength conversion layer 30B.

In the present modified example, the light in the wavelength conversion layer 30B can also be collected and made incident on the light-transmitting plate 40B in the arrangement direction D1 of the wavelength conversion layers 30B. Therefore, after high-intensity light is concentrated in both the arrangement direction D1 and the lateral direction D2, the light is extracted to the outside. Accordingly, it is possible to provide the light-emitting device 10B having the plurality of light-emitting elements 20 with high operation stability and light extraction efficiency.

As shown in the first exemplary embodiment and the first and second modified examples thereof, the wavelength conversion layer 30(A,B) should have an inclined portion on any one of the side surfaces of the entire outer edge portion of the wavelength conversion layers 30(A,B). That is, at least one of the side surfaces of the wavelength conversion layers 30B forming the entire outer edge portion of the wavelength conversion layers 30(A,B) may have the inclined portion S22 inclined from the direction perpendicular to the substrate 11 toward the inside of the wavelength conversion layer 30(A,B).

Depending on the use application, each of the side surfaces S2 extending along the arrangement direction D1 of the wavelength conversion layer may have the inclined portion S22, for example, like the wavelength conversion layer 30.

Figure 5A:
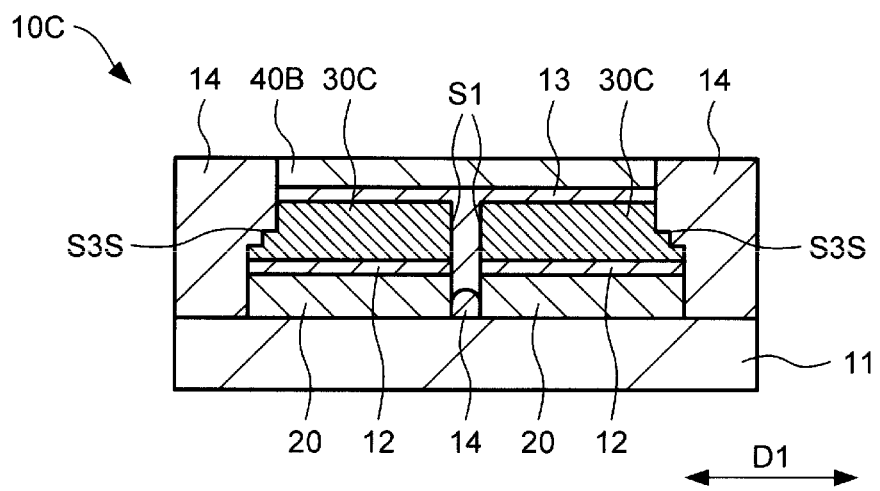
FIG. 5A is a cross-sectional view of the light-emitting device according to a third modified example of the first exemplary embodiment.
Figure 5B:
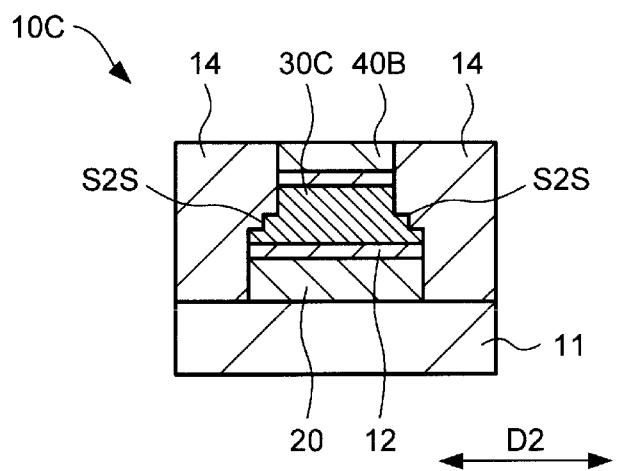
FIG. 5B is a cross-sectional view of the light-emitting device according to the third modified example of the first exemplary embodiment.

FIGS. 5A and 5B are cross-sectional views of a light-emitting device 10C according to a third modified example of the first exemplary embodiment. FIG. 5A is a cross-sectional view of the light-emitting elements 20 taken along the arrangement direction D1 in the light-emitting device 10C. FIG. 5B is a cross-sectional view taken along the lateral direction D2 of the light-emitting element 20 in the light-emitting device 10C. The light-emitting device 10C will be described with reference to FIGS. 5A and 5B.

The light-emitting device 10C has the same configuration as that of the light-emitting device 10B except for the configuration of the wavelength conversion layer 30C. In the light-emitting device 10C, each of the wavelength conversion layers 30C has a side surface shape such that the length of each of the arrangement direction D1 and the lateral direction D2 of the wavelength conversion layer 30C gradually decreases as the distance from the light-emitting element 20 increases. That is, each of the side surfaces S2S and S3S forming the outer edge portion of the wavelength conversion layers 30C is formed in a stepped shape so as to approach the inside of the wavelength conversion layer 30C.

The wavelength conversion layer 30C may be manufactured, for example, by processing the fluorescent material ceramic plate 30P using a blade having a tip portion of a stepped structure instead of the first blade B1 illustrated in FIG. 2A and the second blade B2 illustrated in FIG. 2B.

As in the present modified example, even if the wavelength conversion layer 30C has the side surfaces S2S and S3S in which the length in the arrangement direction D1 and the length in the lateral direction D2 are gradually reduced, the same effects as those of the light-emitting device 10B can be obtained. Accordingly, it is possible to provide the light-emitting device 10C having the plurality of light-emitting elements 20 with high operation stability and light extraction efficiency.

Figure 6:
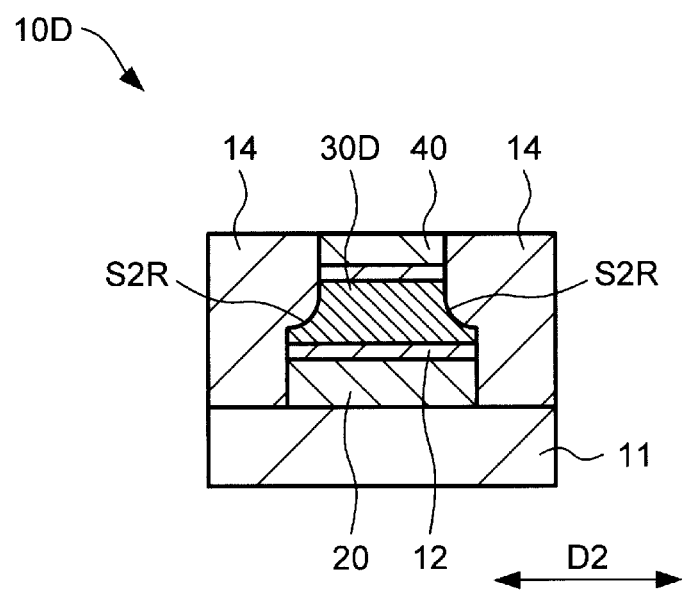
FIG. 6 is a cross-sectional view of the light-emitting device according to a fourth modified example of the first exemplary embodiment.

FIG. 6 is a cross-sectional view taken along the lateral direction D2 of the light-emitting element 20 in a light-emitting device 10D according to a fourth modified example of the first exemplary embodiment. The light-emitting device 10D will be described with reference to FIG. 6. The light-emitting device 10D has the same configuration as that of the light-emitting device 10 except for the configuration of the wavelength conversion layer 30D. In the present modified example, the wavelength conversion layer 30D has a curved side surface S2R. Specifically, in the present modified example, the wavelength conversion layer 30D has an inclined portion having a curved surface shape recessed toward the substrate 11, instead of the inclined portion S22 in the wavelength conversion layer 30.

The wavelength conversion layer 30D may be manufactured, for example, by processing the fluorescent ceramic plate 30P (e.g., FIGS. 2A and 2B) with a blade with a corresponding shape. When the wavelength conversion layer 30D is processed, instead of the first blade B1 illustrated in FIG. 2A, a blade having a tip portion having a curved cross-sectional shape (R shape) and the second blade B2 illustrated in FIG. 2B may be used.

Even when the side surface S2R of the wavelength conversion layer 30D has a curved inclined portion, high operation stability and light extraction efficiency can be obtained. Also in the present modified example, it is preferable that the side surface S2R of the wavelength conversion layer 30D has the vertical portions S21 and S23 in addition to the inclined portion having the curved surface shape, similarly to the wavelength conversion layer 30.

Figure 7:
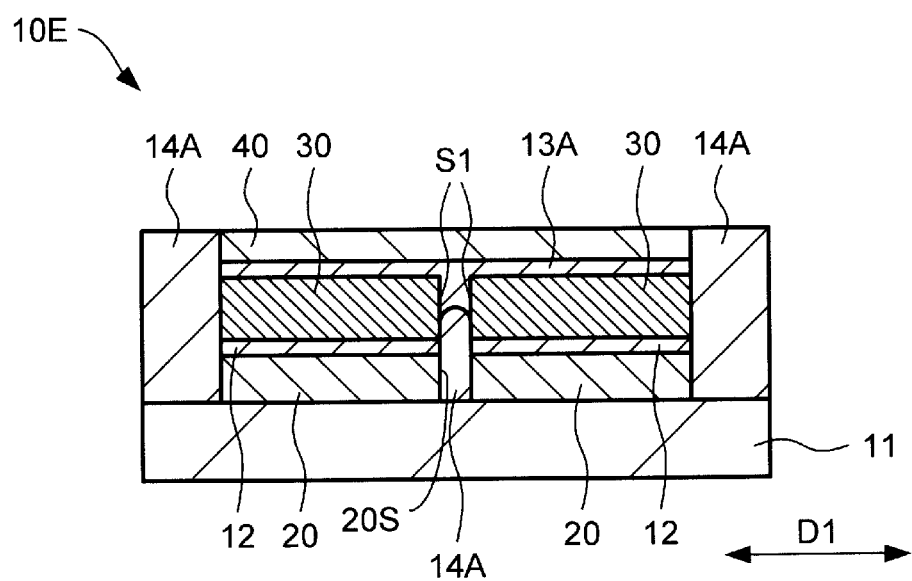
FIG. 7 is a cross-sectional view of the light-emitting device according to a fifth modified example of the first exemplary embodiment.

FIG. 7 is a cross-sectional view of the light-emitting elements 20 taken along the arrangement direction D1 in a light-emitting device 10E according to a fifth modified example of the first exemplary embodiment. The light-emitting device 10E will be described with reference to FIG. 7. The light-emitting device 10E has the same configuration as that of the light-emitting device 10 except for the configuration of the adhesive 13A and the reflective resin 14A.

The reflective resin 14A is formed so as to surround the entire side surfaces 20S of each of the light-emitting elements 20. As a result, the light emitted from the light-emitting element 20 enters the wavelength conversion layer 30 with a high probability. Therefore, high light extraction efficiency can be obtained. The reflective resin 14A can be formed by adjusting the amount of the adhesive 13A when the light-transmitting plate 40 is bonded, and filling the gap with a resin material while preventing the adhesive 13A from spreading to the side surfaces 20S of the light-emitting element 20.

In the present modified example, the adhesive 13A fills the upper part of the region between each of the wavelength conversion layers 30 and another wavelength conversion layers 30 adjacent thereto. That is, the reflective resin 14A does not fill all the regions between the adjacent wavelength conversion layers 30. Accordingly, as with the light-emitting device 10, light emitted from the side surface S1 of the wavelength conversion layer 30 enters the portion of the light-transmitting plate 40 corresponding to the region between the adjacent wavelength conversion layers 30. Therefore, the intensity uniformity of light can be maintained.

As described above, in the present modified example, the light-emitting device 10D includes the reflective resin 14A that covers the entire side surfaces 20S of the light-emitting elements 20, the side surfaces of the wavelength conversion layer 30, and the side surfaces of the light-transmitting plate 40. Accordingly, it is possible to provide the light-emitting device 10D having the plurality of light-emitting elements 20 with high operation stability and light extraction efficiency.

Second Exemplary Embodiment

Figure 8A:
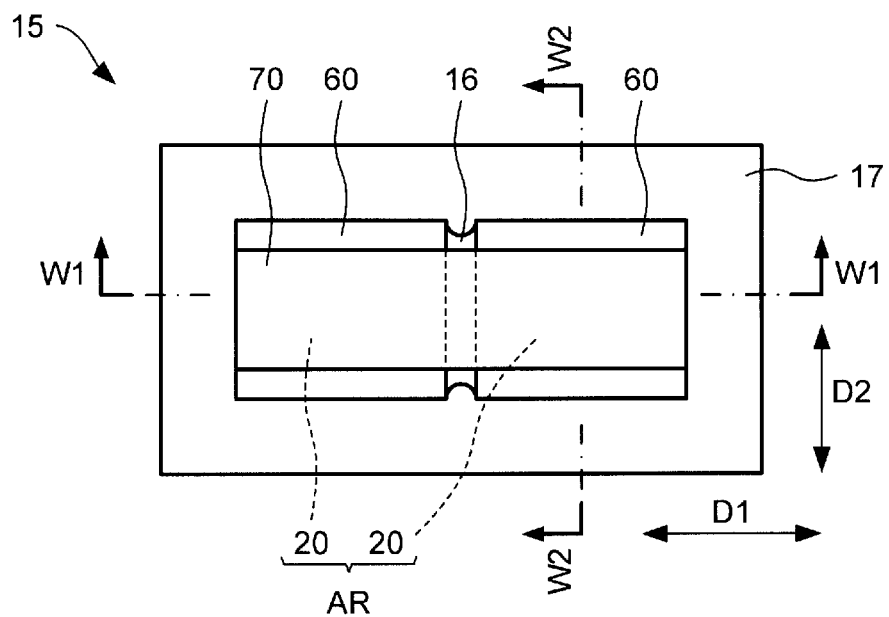
FIG. 8A is a top plan view of a light-emitting device according to a second exemplary embodiment made in accordance with the principles of the presently disclosed subject matter.
Figure 8B:
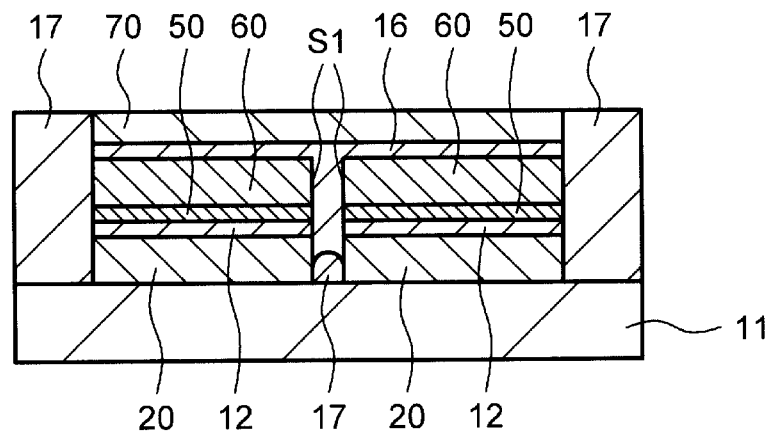
FIG. 8B is a cross-sectional view of the light-emitting device according to the second exemplary embodiment taken along line W1-W1 in FIG. 1A.
Figure 8C:
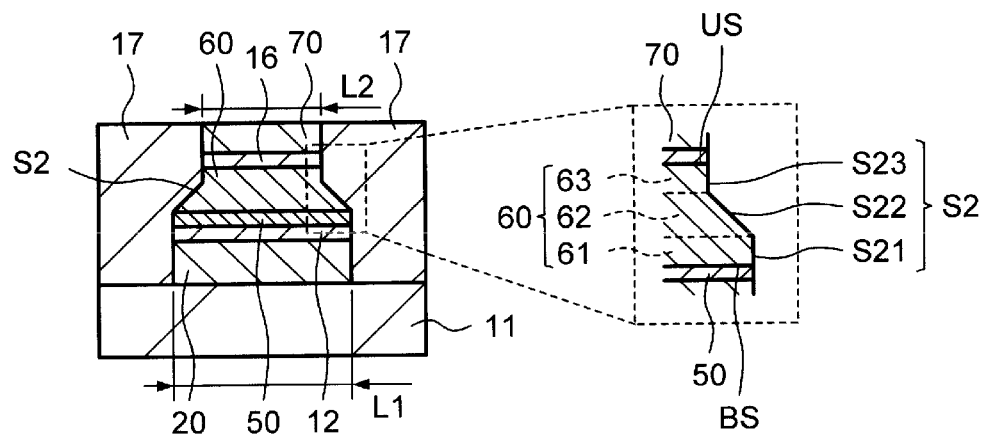
FIG. 8C is a cross-sectional view of the light-emitting device according to the second exemplary embodiment taken along line W2-W2 in FIG. 1A.

FIG. 8A is a top plan view of a light-emitting device 15 according to a second exemplary embodiment. FIGS. 8B and 8C are cross-sectional views of the light-emitting device 15 taken along line W1-W1 and taken along line W2-W2 of FIG. 8A, respectively. The light-emitting device 15 will be described with reference to FIGS. 8A to 8C.

The light-emitting device 15 includes a substrate 11, a plurality of light-emitting elements 20 arranged on the substrate 11, and a plurality of wavelength conversion layers 50 each disposed on each of the plurality of light-emitting elements 20 with a light-transmitting adhesive 12 interposed therebetween. In the present exemplary embodiment, the wavelength conversion layer 50 has a bottom surface with the same shape and size (area) as those of each of the light-emitting elements 20, and has a substantially uniform layer thickness. The side surfaces of the wavelength conversion layer 50 extends in a direction perpendicular to the substrate 11, in this exemplary embodiment, in a direction perpendicular to the mounting surface of the light-emitting element 20 on the substrate 11.

In addition, the light-emitting device 15 includes a plurality of individual light-transmitting plates 60 each disposed on each of the plurality of wavelength conversion layers and each having a bottom surface BS on a side closer to the wavelength conversion layer 50 and an upper surface US smaller than the bottom surface BS with a side surface shape in which the length thereof in the lateral direction D2 perpendicular to the arrangement direction D1 of the wavelength conversion layers 50 decreases from the bottom surface BS toward the upper surface US, and a common light-transmitting plate 70 disposed over the upper surfaces US of the plurality of individual light-transmitting plates 60.

In other words, this exemplary embodiment corresponds to a case where the light-transmitting plate 60 is individually disposed on each of the wavelength conversion layers 50, and the light-transmitting plate 60 has the side surface S2 having an inclined portion S22.

Specifically, as illustrated in FIG. 8C, each of the individual light-transmitting plates 60 has the bottom surface BS which is a principal surface on the wavelength conversion layer 50 side, and the upper surface US which is a principal surface on the opposite side to the bottom surface BS and is smaller than the bottom surface BS. The width L2 of the upper surface US of each of the individual light-transmitting plates 60 in the lateral direction D2 is shorter than the width L1 of the bottom surface BS of each of the individual light-transmitting plates 60 in the lateral direction D2.

As illustrated in FIG. 8B, in the present exemplary embodiment, the side surface S1 of each of the individual light-transmitting plates 60 facing the other adjacent individual light-transmitting plate 60 has a shape extending in the direction perpendicular to the substrate 11.

On the other hand, as illustrated in FIG. 8C, the side surface S2 extending in the arrangement direction D1 of each of the individual light-transmitting plates 60 has the inclined portion (tapered portion) S22 inclined from the direction perpendicular to the substrate 11 toward the inside of the individual light-transmitting plate 60.

In this exemplary embodiment, the side surface S2 of the individual light-transmitting plate 60 includes a vertical portion (first vertical portion) S21 extending from the bottom surface BS of the individual light-transmitting plate 60 in the direction perpendicular to the substrate 11, the inclined portion S22 continued from the vertical portion S21, and a vertical portion (second vertical portion) S23 extending in the direction perpendicular to the substrate 11 from the inclined portion S22 and reaching the upper surface US.

Therefore, in this exemplary embodiment, it can be said that each of the individual light-transmitting plates 60 has a structure in which a prism-shaped portion 61, a frustum-shaped portion 62, and a prism-shaped portion 63 having a bottom surface smaller than that of the prism-shaped portion 61 are integrally formed from the light-emitting element 20 side.

In this exemplary embodiment, the individual light-transmitting plate 60 and the wavelength conversion layer 50 that are integrally formed are disposed on the light-emitting element 20. For example, a mixture of fluorescent material particles in an inorganic glass binder is printed on a glass plate, sintered, and then cut into pieces to form a product in which the wavelength conversion layer 50 is integrally formed on the individual light-transmitting plate 60. The integrally molded individual light-transmitting plate 60 and the wavelength conversion layer 50 are disposed on the light-emitting element 20 from the wavelength conversion layer 50 side with the adhesive layer 12 interposed therebetween. In this manner, the light-emitting element 20, the wavelength conversion layer 50, and the individual light-transmitting plate 60 can be formed.

The common light-transmitting plate 70 is disposed across the upper surfaces US of the plurality of respective individual light-transmitting plates 60 with the adhesive 16 interposed therebetween. The individual light-transmitting plate 60 and the common light-transmitting plate 70 have a light-transmitting property with respect to light emitted from each of the light-emitting elements 20.

The common light-transmitting plate 70 is an integrally formed plate-like member disposed on the individual light-transmitting plates 60 so as to cover the entire upper surfaces US of the individual light-transmitting plates 60. In the present exemplary embodiment, the common light-transmitting plate 70 has a width corresponding to the width L2 of the upper surface US of each of the individual light-transmitting plates 60 in the lateral direction D2. The common light-transmitting plate 70 also has a length that is the sum of the lengths of the respective upper surfaces US of the individual light-transmitting plates 60 in the arrangement direction D1 and the distance between the adjacent individual light-transmitting plates 60.

The adhesive 16 for bonding the common light-transmitting plate 70 and each of the individual light-transmitting plates 60 is applied to fill a region (space) between each of the individual light-transmitting plates 60 and another individual light-transmitting plate 60 adjacent thereto. Therefore, the adhesive 16 is provided over the entire bottom surface of the common light-transmitting plate 70. The adhesive 16 has a light-transmitting property with respect to the light output from the light-emitting element 20 and the wavelength conversion layer 50.

In addition, the light-emitting device 15 includes a reflective resin 17 that surrounds and covers the side surfaces of the light-emitting elements 20, the side surfaces of the wavelength conversion layers 50, the side surfaces forming the outer edge portions of the individual light-transmitting plates 60, and the side surfaces of the common light-transmitting plate 70. The upper surface of the common light-transmitting plate 70 is exposed from (is not covered with) the reflective resin 17. The reflective resin 17 is formed of a resin material having reflectivity with respect to light emitted from each of the light-emitting elements 20 and light output from the wavelength conversion layers 50.

Light emitted from each of the light-emitting elements 20 enters each of the wavelength conversion layers 50, and after the wavelength of light is partially converted, the light passes through the individual light-transmitting plates 60, and is extracted from the upper surface of the common light-transmitting plate 70 to the outside. Light traveling from each of the light-emitting elements 20, each of the wavelength conversion layers 30, each of the individual light-transmitting plates 60, and the common light-transmitting plate 70 toward the respective side surfaces thereof is reflected by the reflective resin 17. Therefore, most of the light is extracted to the outside only from the upper surface of the common light-transmitting plate 70.

In the present exemplary embodiment, the individual light-transmitting plates 60 are each formed on each of the wavelength conversion layers 50. By disposing the common light-transmitting plate 70 after the individual light-transmitting plates 60 are provided on the wavelength conversion layers 50, light can be collected by the individual light-transmitting plates 60 and made incident on the common light-transmitting plate 70 while making the wavelength conversion efficiency in the wavelength conversion layers 50 uniform. That is, as compared with the case where the side surfaces of the wavelength conversion layers are inclined as in the case of the wavelength conversion layers 30, the paths of the light passing through the wavelength conversion layers 50 are stabilized. Therefore, the color unevenness of the light emitted from the wavelength conversion layers 50 is suppressed. In addition, since the light-transmitting adhesive 16 fills the region between the adjacent individual light-transmitting plates 60, the intensity uniformity of light is improved. Therefore, high wavelength uniformity, high intensity uniformity, and high light extraction efficiency can be ensured.

Similarly to the light-emitting device 10, the wavelength conversion layer 50 is individually disposed on each of the light-emitting elements 20 via the thin adhesive layer 12 having a uniform thickness, so that high heat dissipation and operation stability can be ensured. Accordingly, it is possible to provide the light-emitting device 15 having the plurality of light-emitting elements 20 with high operation stability and light extraction efficiency. In consideration of suppression of color unevenness, it is preferable that the side surfaces of the wavelength conversion layers 50 extend in a direction perpendicular to the substrate 11.

Figure 9:
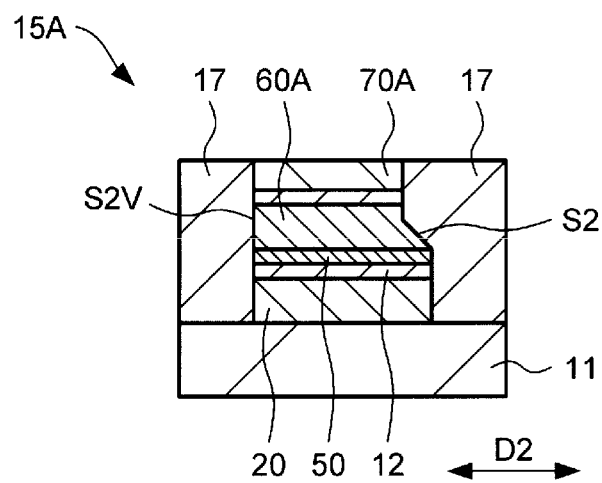
FIG. 9 is a cross-sectional view of the light-emitting device according to a first modified example of the second exemplary embodiment.

FIG. 9 is a cross-sectional view taken along the lateral direction D2 of the light-emitting element 20 in a light-emitting device 15A according to a first modified example of the second exemplary embodiment. The light-emitting device 15A has the same configuration as that of the light-emitting device 15 except for the configuration of the individual light-transmitting plate 60A and the common light-transmitting plate 70A. In the light-emitting device 15A, one side surface S2 of side surfaces S2 and S2V extending along the arrangement direction D1 of the individual light-transmitting plate 60A has a shape similar to that of the individual light-transmitting plate 60. On the other hand, the other side surface S2V has a shape extending along a direction perpendicular to the substrate 11.

Like the common light-transmitting plate 70, the common light-transmitting plate 70A has substantially the same outer shape as the outer edge surrounding the entire upper surfaces of the individual light-transmitting plates 60A. As in the present modified example, only one of the side surfaces of the individual light-transmitting plate 60A in the lateral direction D2 may be inclined. Even in this case, the length of the individual light-transmitting plate 60A in the lateral direction D2 gradually decreases from the bottom surface BS toward the upper surface US. In addition, since the side surface S2 has the inclined portion S22, light collecting property of the individual light-transmitting plate 60A can be obtained. Accordingly, it is possible to provide the light-emitting device 15A having the plurality of light-emitting elements 20 with high operation stability and light extraction efficiency.

By inclining only one side surface S2 as in the present modified example, light of a relatively high luminance is extracted from the side surface S2 side, and light of a relatively low luminance is extracted from the side surface S2V side. That is, it is possible to intentionally provide a difference in luminance in the lateral direction D2 of the individual light-transmitting plate 60A. Therefore, it can be said that the light-emitting device 15A has a configuration suitable for an application in which it is preferable to provide a difference in luminance for each region, such as a case where the light-emitting device 15A is used as a vehicular lamp.

Figure 10:
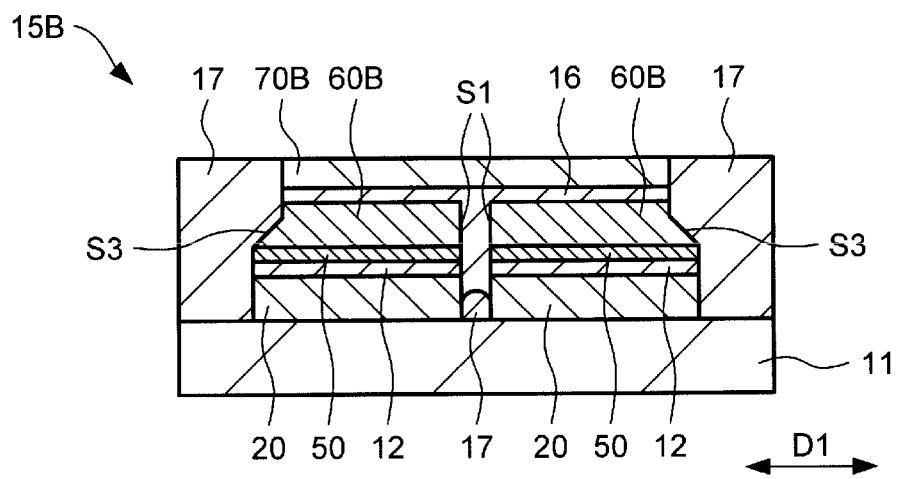
FIG. 10 is a top plan view of the light-emitting device according to a second modified example of the second exemplary embodiment.

FIG. 10 is a cross-sectional view taken along the arrangement direction D1 of the light-emitting elements 20 in a light-emitting device 15B according to a second modified example of the second exemplary embodiment. The light-emitting device 15B has the same configuration as that of the light-emitting device 15 except for the configuration of the individual light-transmitting plate 60B and the common light-transmitting plate 70B. In the light-emitting device 15B, the individual light-transmitting plate 60B has an inclined side surface shape in which the side surface S3 extending along the lateral direction D2 at the end in the arrangement direction D1 of the individual light-transmitting plate 60B has an inclined side surface shape. The common light-transmitting plate 70B has substantially the same outer shape as the outer edge surrounding the entire upper surfaces of the wavelength conversion layers 30B.

That is, in the present modified example, each of the individual light-transmitting plates 60B has a side surface shape in which both the length in the arrangement directions D1 and in the lateral direction D2 of the individual light-transmitting plates 60B decreases as the distance from the wavelength conversion layer 50 increases. Therefore, all of the side surfaces S2 and S3 forming the outer edge portion of the individual light-transmitting plate 60B in each of the individual light-transmitting plates 60B have a shape inclined from the direction perpendicular to the substrate 11 toward the inner side of the individual light-transmitting plate 60B.

In the present modified example, the light in the individual light-transmitting plate 60B can also be collected and made incident on the light-transmitting plate 70B in the arrangement direction D1 of the individual light-transmitting plates 60B. Therefore, after high-intensity light is concentrated in both the arrangement direction D1 and the lateral direction D2, the light is extracted to the outside. Accordingly, it is possible to provide the light-emitting device 15B having the plurality of light-emitting elements 20 with high operation stability and light extraction efficiency.

Also in the individual light-transmitting plates 60B, any one of the side surfaces of the entire outer edge portions of the individual light-transmitting plates 60B may have the inclined portion S22. That is, at least one of the side surfaces of the individual light-transmitting plates 60B forming the entire outer edge portion of the individual light-transmitting plates 60B may have the inclined portion S22 inclined from the direction perpendicular to the substrate 11 toward the inner side of the individual light-transmitting plate 60B.

Depending on the use application, each of the side surfaces S2 extending along the arrangement direction D1 of the individual light-transmitting plates 60 may have the inclined portion S22, for example, like the individual light-transmitting plate 60.

Figure 11:
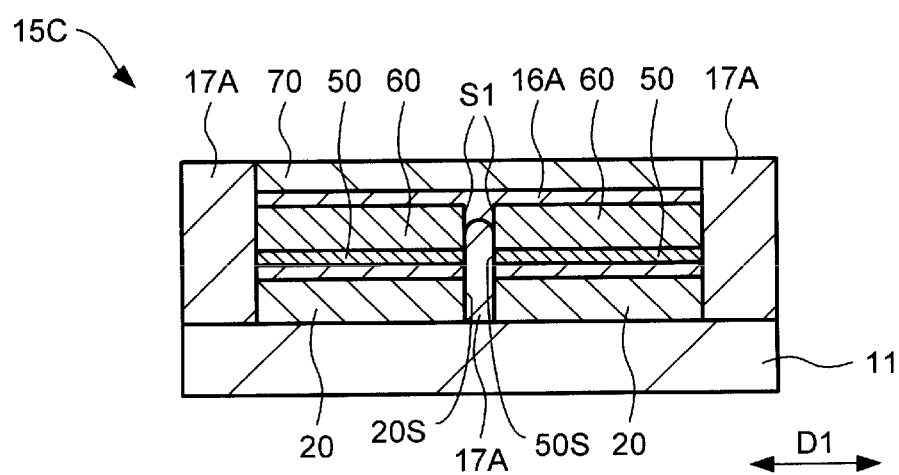
FIG. 11 is a cross-sectional view of the light-emitting device according to a third modified example of the second exemplary embodiment.

FIG. 11 is a cross-sectional view taken along the arrangement direction D1 of the light-emitting elements 20 in a light-emitting device 15C according to a third modified example of the second exemplary embodiment. The light-emitting device 15C has the same configuration as that of the light-emitting device 15 except for the configuration of the adhesive 16A and the reflective resin 17A.

The reflective resin 17A is formed so as to surround the entire side surfaces 20S of each of the light-emitting elements 20 and the entire side surfaces 50S of each of the wavelength conversion layers 50. As a result, the light emitted from the light-emitting element 20 enters the individual light-transmitting plate 60 with a high probability. Therefore, high light extraction efficiency can be obtained. The reflective resin 17A can be formed by adjusting the amount of the adhesive 16A when the common light-transmitting plate 70 is bonded, and filling the gap with a resin material while preventing the adhesive 16A from spreading to the side surfaces 50S of the wavelength conversion layer 50.

In the present modified example, the adhesive 16A fills the upper part of the region between each of the individual light-transmitting plates 60 and another individual light-transmitting plate 60 adjacent thereto. That is, the reflective resin 17A does not fill all the regions between the adjacent individual light-transmitting plates 60. Accordingly, as with the light-emitting device 15, light emitted from the side surface S1 of the individual light emitting plate 60 enters the portion of the common light-transmitting plate 70 corresponding to the region between the adjacent individual light-transmitting plates 60. Therefore, the intensity uniformity of light can be maintained.

As described above, in the present modified example, the light-emitting device 15C includes the reflective resin 17A that covers the entire side surfaces 20S of each of the light-emitting elements 20, the entire side surfaces 50S of each of the wavelength conversion layers 50, and the side surfaces of the individual light-transmitting plates 60 and the common light-transmitting plate 70. Accordingly, it is possible to provide the light-emitting device 15C having the plurality of light-emitting elements 20 with high operation stability and light extraction efficiency.

Figure 12:
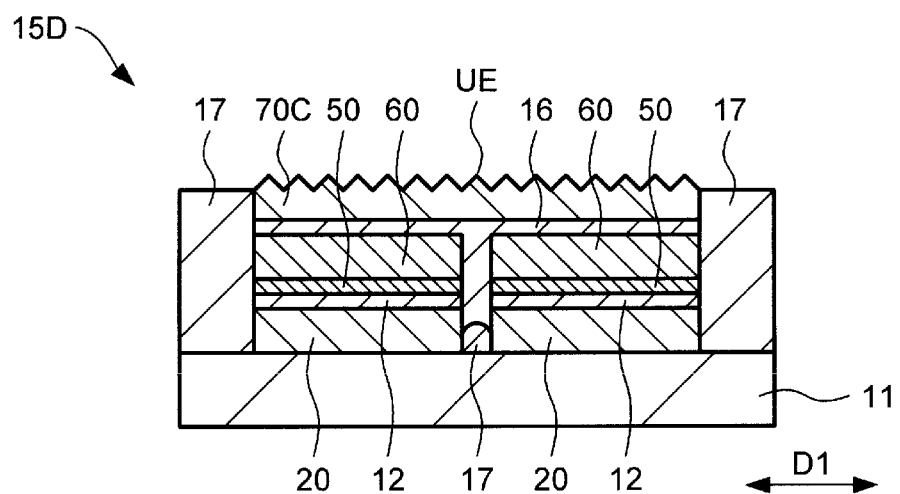
FIG. 12 is a cross-sectional view of the light-emitting device according to a fourth modified example of the second exemplary embodiment.

FIG. 12 is a cross-sectional view taken along the arrangement direction D1 of the light-emitting elements 20 in a light-emitting device 15D according to a fourth modified example of the second exemplary embodiment. The light-emitting device 15D has the same configuration as that of the light-emitting device 15 except for the configuration of the common light-transmitting plate 70C. In the light-emitting device 15D, the common light-transmitting plate 70C has an uneven structure UE on the upper surface of the common light-transmitting plate 70C, that is, the light extraction surface. That is, the light incident on the common light-transmitting plate 70C is taken out to the outside through the uneven structure UE.

Since the common light-transmitting plate 70C has the uneven structure UE on the light extraction surface, light is more easily emitted from the common light-transmitting plate 70C than a flat light extraction surface. Therefore, the light extraction efficiency is improved. Thus, it is possible to provide the light-emitting device 15D having the plurality of light-emitting elements 20 with high operation stability and light extraction efficiency.

Figure 13:
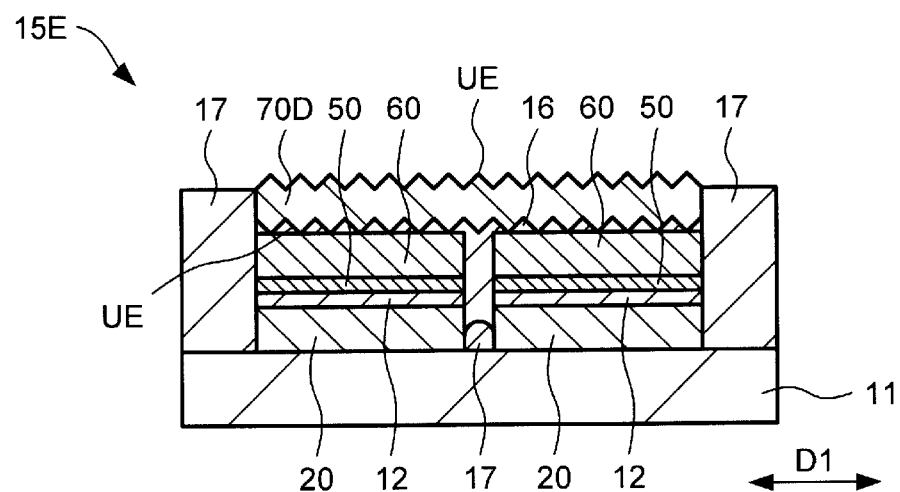
FIG. 13 is a cross-sectional view of the light-emitting device according to a fifth modified example of the second exemplary embodiment.

FIG. 13 is a cross-sectional view taken along the arrangement direction D1 of the light-emitting elements 20 in a light-emitting device 15E according to a fifth modified example of the second embodiment. The light-emitting device 15E has the same configuration as that of the light-emitting device 15D except for the configuration of the common light-transmitting plate 70D. In the present modified example, the common light-transmitting plate 70D has an uneven structure UE on each of the upper surface and the bottom surface. That is, the common light-transmitting plate 70D has an uneven structure UE on both the light incident surface from the individual light-transmitting plate 60 and the light extraction surface to the outside. Therefore, a large amount of light passes through the common light-transmitting plate 70D and is extracted to the outside. Accordingly, it is possible to provide the light-emitting device 15E having the plurality of light-emitting elements 20 with high operation stability and light extraction efficiency.

Figure 14A:
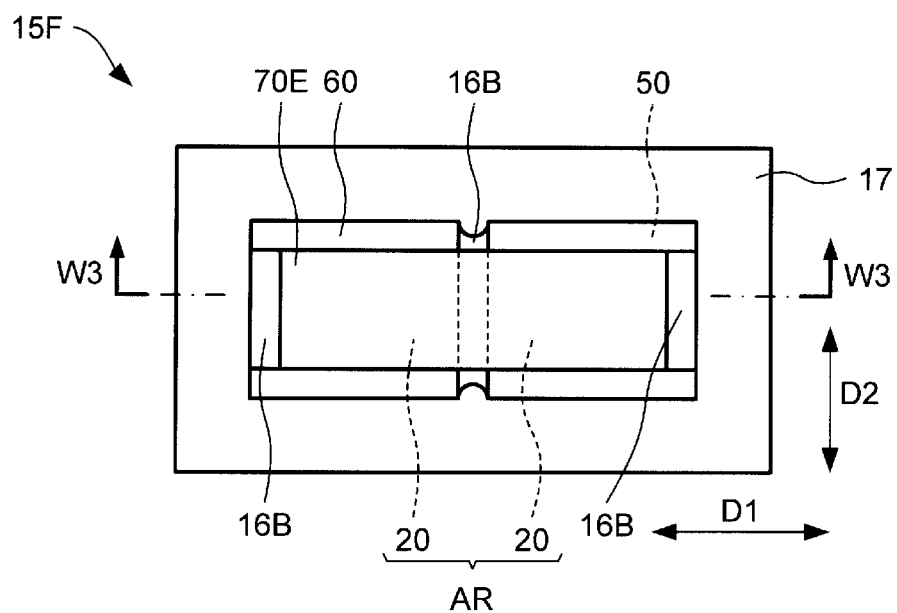
FIG. 14A is a cross-sectional view of the light-emitting device according to a sixth modified example of the second exemplary embodiment.
Figure 14B:
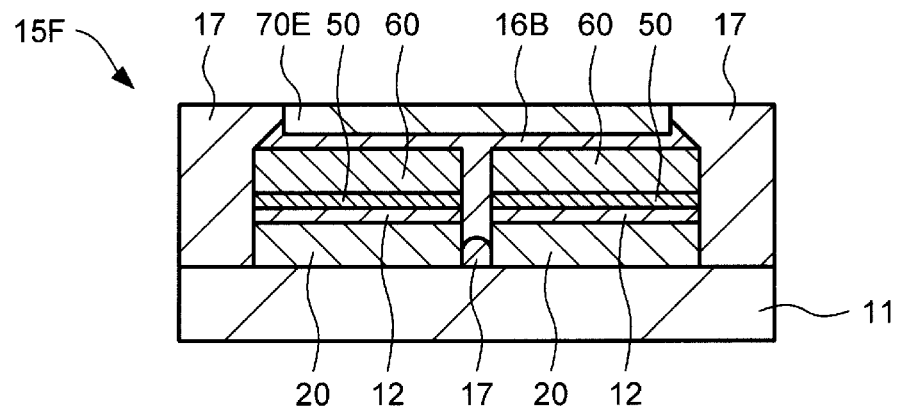
FIG. 14B is a cross-sectional view of the light-emitting device according to the sixth modified example of the second exemplary embodiment.

FIG. 14A is a top plan view of a light-emitting device 15F according to a sixth modified example of the second exemplary embodiment. FIG. 14B is a cross-sectional view of the light-emitting device 15F taken along line W3-W3 of FIG. 14A. The light-emitting device 15F has the same configuration as that of the light-emitting device 15 except for the configuration of the adhesive 16B and the common light-transmitting plate 70E.

In the light-emitting device 15F, the common light-transmitting plate 70E has a length smaller than the length between the end portions of the entire plurality of individual light-transmitting plates 60 (between the left end portion of the left individual light-transmitting plate 60 and the right end portion of the right individual light-transmitting plate 60 in FIG. 14A) in the arrangement direction D1 of the individual light-transmitting plates 60. In addition, the adhesive 16B for bonding the individual light-transmitting plates 60 and the common light-transmitting plate 70E is provided from the upper surfaces US of the individual light-transmitting plates 60 to the end side surfaces of the common light-transmitting plate 70E in the arrangement direction D1 of the individual light-transmitting plates 60. The adhesive 16B has a light-transmitting property with respect to the light output from the light-emitting elements 20 and the wavelength conversion layers 50.

In the present modified example, the adhesive 16B provided on the end side surface of the common light-transmitting plate 70E functions as a light collecting portion that collects light from each of the individual light-transmitting plates 60 onto the common light-transmitting plate 70E. This makes it possible to obtain an effect of collecting light by the adhesive 16B in accordance with, for example, the actual length of the common light-transmitting plate 70E, the ease of processing of the individual light-transmitting plates 60, and the like. Therefore, the optical design thereof can be performed with a high degree of freedom. Accordingly, it is possible to provide the light-emitting device 15F having the plurality of light-emitting elements 20 with high operation stability and light extraction efficiency.

Figure 15:
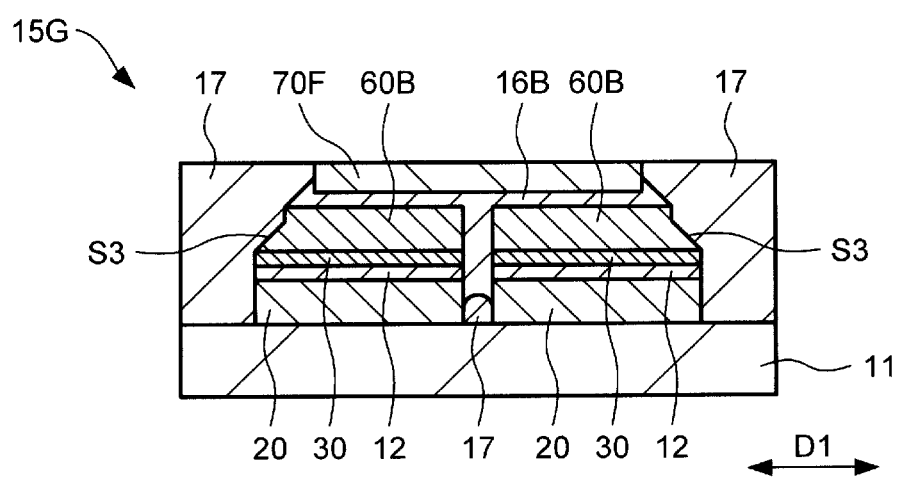
FIG. 15 is a cross-sectional view of the light-emitting device according to a seventh modified example of the second exemplary embodiment.

FIG. 15 is a cross-sectional view taken along the arrangement direction D1 of the light-emitting elements 20 in a light-emitting device 15G according to a seventh modified example of the second exemplary embodiment. The light-emitting device 15G has a configuration corresponding to a case where the individual light-transmitting plate 60 of the light-emitting device 15F is replaced with the individual light-transmitting plate 60B of the light-emitting device 15B.

In the present modified example, in the arrangement direction D1 of the light-emitting elements 20, light can be collected on the common light-transmitting plate 70F by both the individual light-transmitting plate 60B and the adhesive 16B. Accordingly, it is possible to provide the light-emitting device 15G having the plurality of light-emitting elements 20 with high operation stability and light extraction efficiency.

The above-described embodiments and modified examples thereof may be combined with each other. For example, the light-transmitting plate 40 of the light-emitting device 10 may have an uneven structure UE on the upper surface like the common light-transmitting plate 70C of the light-emitting device 15D. Further, for example, the light-transmitting plate 40 of the light-emitting device 10 may have a length smaller than the length between the end portions of the wavelength conversion layers 30, and the adhesive 13 may be provided on the side surfaces of the light-transmitting plate 40 like the adhesive 16B.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A light-emitting device comprising:
a substrate;
a plurality of light-emitting elements aligned and arranged on the substrate in an arrangement direction;
a plurality of wavelength conversion layers each disposed on each of the plurality of light-emitting elements with a first light-transmitting adhesive interposed therebetween;
a light-transmitting plate disposed over upper surfaces of the plurality of wavelength conversion layers; and
a reflective resin formed on the substrate to surround the plurality of the light-emitting elements, the plurality of the wavelength conversion layers, and the light-transmitting plate, wherein
the light-transmitting plate is disposed on the plurality of the wavelength conversion layers with a second light-transmitting adhesive interposed therebetween,
a number of the plurality of the wavelength conversion layers is the same as a number of the plurality of the light-emitting elements,
each of the plurality of the wavelength conversion layers is located between an upper surface of each of the plurality of the light-emitting elements and a lower surface of the light-transmitting plate, each of the plurality of the wavelength conversion layers not extending below the upper surface of each of the plurality of the light-emitting elements,
each of the plurality of the wavelength conversion layers includes a bottom surface, the upper surface opposed to the bottom surface and having a smaller area than that of the bottom surface, and a plurality of side surfaces connecting the bottom surface and the upper surface to form outer edge portions,
the plurality of side surfaces include a vertical side surface part and an inclined side surface part, the vertical side surface part extending in a direction perpendicular to the substrate, the vertical side surface part being connected to a vertical side surface of each of the plurality of the light-emitting elements such that an edge of the bottom surface of the each of the plurality of the wavelength conversion layers is aligned with an edge of the upper surface of each of the plurality of the light-emitting elements, the inclined side surface part having at least one of an inclined portion and a stepped portion, the inclined portion being inclined inwardly from a side of the bottom surface of the each of the plurality of the wavelength conversion layers to a side of the upper surface of the each of the plurality of the wavelength conversion layers, the inclined side surface part being not directly connected to the vertical side surface of each of the plurality of the light-emitting elements,
the first light-transmitting adhesive bonds each of the plurality of the wavelength conversion layers onto the upper surface of each of the plurality of the light emitting elements,
the second light-transmitting adhesive is located between adjacent ones of the plurality of the wavelength conversion layers,
the vertical side surface part of the wavelength conversion layer is in contact with the second light-transmitting adhesive,
the second light-transmitting adhesive extends in the direction perpendicular to the substrate, and
the reflective resin is in contact with at least one side surface of each of the plurality of light-emitting elements, at least a part of the inclined side surface part of each of the plurality of the wavelength conversion layers, and side surfaces of the light-transmitting plate forming an outer edge.

2. The light-emitting device according to claim 1, wherein the inclined side surface part has a first surface extending upward from the bottom surface in the direction perpendicular to the substrate, a second surface extending downward from the upper surface in the direction perpendicular to the substrate, and the inclined portion disposed between the first surface and the second surface.

3. The light-emitting device according to claim 2, wherein each of the side surfaces extending in the arrangement direction out of the side surfaces forming the outer edge portions of the plurality of wavelength conversion layers has the inclined portion.

4. The light-emitting device according to claim 1, wherein the first light-transmitting adhesive has a thin and uniform layer thickness enough to form a heat radiation path.

5. The light-emitting device according to claim 1, wherein the first light-transmitting adhesive is provided only between each of the plurality of the wavelength conversion layers and the upper surface of each of the plurality of the light emitting elements.

6. The light-emitting device according to claim 1, wherein the wavelength conversion layers are ceramic plates.

7. The light-emitting device according to claim 6, wherein the light-transmitting plate is a plate-like member that is integrally formed to entirely cover the upper surfaces of the wavelength conversion layers.

8. The light-emitting device according to claim 1, wherein the light-transmitting plate is a plate-like member that is integrally formed to entirely cover the upper surfaces of the wavelength conversion layers.

9. The light-emitting device according to claim 1, wherein the inclined side surface part is formed on both sides in a direction parallel to a surface of the substrate and perpendicular to the arrangement direction in which the plurality of wavelength conversion layers are arranged in a row and extend in the arrangement direction.

10. The light-emitting device according to claim 1, wherein the inclined side surface part is formed on at least one side in a direction parallel to a surface of the substrate and perpendicular to the arrangement direction in which the plurality of wavelength conversion layers are arranged in a row and extend in the arrangement direction.

11. The light-emitting device according to claim 1, wherein the inclined side surface part is formed on both sides in a direction parallel to a surface of the substrate and perpendicular to the arrangement direction in which the plurality of wavelength conversion layers are arranged in a row and extend in the arrangement direction and also are formed on both sides in the direction parallel to the surface of the substrate and in the arrangement direction and extend in the direction perpendicular to the arrangement direction in the respective wavelength conversion layers.

12. The light-emitting device according to claim 1, wherein the vertical side surface part is located at least on respective sides of two adjacent wavelength conversion layers facing to each other with the second light-transmitting adhesive therebetween.

* * * * *